United States Patent [19]
Börner et al.

[11] Patent Number: 5,756,224
[45] Date of Patent: May 26, 1998

[54] ORGANIC ELECTROLUMINESCENT COMPONENT

[75] Inventors: Herbert Friedrich Börner, Hamburg; Ulrich Kynast, Roetgen; Wolfgang Busselt; Markus Haase, both of Aachen, all of Germany

[73] Assignee: U.S. Philips Corporation, New York, N.Y.

[21] Appl. No.: 513,373

[22] Filed: Aug. 10, 1995

[30] Foreign Application Priority Data

Aug. 11, 1994 [DE] Germany .................... 44 28 450.0
Aug. 17, 1994 [EP] European Pat. Off. ......... 94202340

[51] Int. Cl.[6] .................................................. H05B 33/14
[52] U.S. Cl. ..................... 428/690; 428/917; 313/503; 313/504
[58] Field of Search ................. 428/690, 917; 313/504, 503

[56] References Cited

U.S. PATENT DOCUMENTS

5,128,587  7/1992  Skotheim et al. ................. 313/504

OTHER PUBLICATIONS

"Bright Red Light—Emitting Organic Electroluminescent Devices having a Europium Complex as an Emitter" J. Kido et al, Appl. Phys. Lett. 65 (17), Oct. 24, 1994, pp. 2124–2126.

"Efficient Light—Emitting Diodes based on Polymers with High Electron Affinities" N.C. Greenham et al, Nature, vol. 365, pp. 628–630.

"Organic Photoreceptors for Imaging Systems" P.M. Borsenberger et al, Marcel Dekker, New York (1993) Chapter 8.

*Primary Examiner*—Charles Nold
*Attorney, Agent, or Firm*—Norman N. Spain

[57] ABSTRACT

An organic electroluminescent component with a layer structure comprising a) a substrate layer,
b) a first transparent electrode layer,
c) one or several functional optoelectronic layer(s) with
  c1) possibly, one or several p-type organic materials with one or several singlet states and one or several triplet states, and
  c2) a luminescent material with one or several organometallic complexes of a rare earth metal ion with organic ligands, in which the rare earth metal ion has an emitting state and the organic ligands have one or several singlet states and one or several triplet states, and
  c3) one or several n-type organic materials with one or several singlet states and one or several triplet states, and
d) a second electrode, wherein the triplet state of lowest energy of the ligands is lower than the triplet states of lowest energy of the n-type and/or the p-type organic materials but higher than above the emitting state of the rare earth metal ion excels through a surprisingly increased luminous efficacy, and in addition has a very good thermal stability while it can be manufactured in a simple process.

12 Claims, 2 Drawing Sheets

ORGANIC ELECTROLUMINESCENT COMPONENT

BACKGROUND OF THE INVENTION

The invention relates to an organic electroluminescent component, for example an electroluminescent diode (LED) for luminous signs, luminaires, solid-state image amplifiers or high information content displays and TV-displays.

Prior-art LEDs are usually semiconductor diodes, i.e. diodes for whose construction inorganic semiconductors such as doped zinc sulphide, silicon, germanium, or III–V semiconductors, for example InP, GaAs, GaAlAs, GaP, or GaN are used with suitable dopants. These semiconductor diodes comprise a p-doped crystal zone and an n-doped crystal zone. In a typical embodiment, first an n-type basic crystal is made through suitable doping of the semiconductor. An only 1 μm thick p-type zone of high doping level, i.e. a high hole density, is then grown thereon.

This p-type layer is covered with a transparent electrode, the n-type layer with a normal metal electrode. When a voltage is applied in the forward direction, electrons migrate from the n-type region and holes from the p-type region into the pn junction, where they recombine, i.e. the electrons fill up the holes in the valency band. The energy released during the recombination is radiated in the form of light quanta. The colour of the radiated light depends on the semiconductor used and its dopant.

Work has been going on for several years on luminescent radiation sources whose emitter material is not an inorganic semiconductor but an organic, electrically conducting material.

Electroluminescent components with luminescing layers built up from organic materials are clearly superior to light sources made from inorganic materials in some respects. An advantage is their easy mouldability and high elasticity, which renders possible novel applications in e.g. luminous signs and displays. These layers may readily be manufactured as large-area, plane, and very thin layers for which, moreover, little material is required. They also excel in their notable brightness accompanied by a low operating voltage.

Furthermore, the colour of the emitted light can be varied over a wide region from approximately 400 nm up to approximately 650 nm through the choice of the luminescent material. These colours have a striking luminance.

Combinations of electrically conducting organic materials with organometallic compounds of rare earth metals have already been used for luminescent radiation sources. An electroluminescent component is known from U.S. Pat. No. 5128587, comprising a layer structure of (a) a substrate which is transparent to visible light, (b) a first electrode which is transparent to visible light, (c) a p-type layer which is transparent to visible light, (d) a luminescent layer which comprises metallorganic complexes of the lanthanides, and (e) a second electrode. The p-type layer may be an organic or inorganic semiconductor of the p-type here, and the organometallic complexes may be embedded in a membrane which consists of compounds capable of forming an addition complex with said metallorganic complex in the excited state. Such an electroluminescent component is characterized by monochrome radiation.

A disadvantage of the components mentioned above is their low efficicy. According to the published results of various working parties, less than several thousandth of the supplied power was converted into light in the first prototypes, while in the meantime the internal quantum efficiency could be raised to approximately 4% (Nature, vol. 365, p. 628), and the external quantum efficiency to 4.2% (J. Appl. Phys. 72, 1957 (1992)).

The low luminous efficicy of the known electroluminescent components with organic materials is also accompanied by an increased thermal load on the components owing to charge transport and non-radiating transitions, which destroys the components in the course of time.

SUMMARY OF THE INVENTION

It is accordingly an object of the invention to provide an organic electroluminescent component with electrically conducting organic materials and metallorganic complexes of rare earth metals which has a high luminous efficacy and a long useful life.

According to the invention, this object is achieved by means of an organic electroluminescent component with a layer structure comprising a) a substrate layer, b) a first transparent electrode layer, provided on said substrate layer, a second electrode layer opposing said first electrode layer c) one or several functional optoelectronic layer(s) with c1) one or several p-type organic materials with one or several singlet states and one or several triplet states, c2) a luminescent material with one or several metallorganic complexes of a rare earth metal ion with organic ligands, in which the rare earth metal ion has an emitting state and the organic ligands have one or several singlet states and one or several triplet states, and c3) one or several n-type organic materials with one or several singlet states and one or several triplet states, and wherein the triplet state of lowest energy of the ligands is lower than the triplet states of lowest energy of the n-type and the p-type organic materials but higher than the emitting state of the rare earth metal ion.

The invention is based on the idea that it should be made possible to increase the luminous efficacy of organic electroluminescent components in that of the excitons generated in the recombination of electrons and holes not only the singlet excitons are used for light generation, as in the prior art, but also the triplet excitons.

An organic electroluminescent component according to the invention accordingly excels through a surprisingly increased luminous efficacy, and in addition has a very good thermal stability while it can be manufactured by simple processes.

It is preferable within the framework of the present invention when a p-type organic material and the luminescent material are present in a first, homogeneous layer, and an n-type organic material is present in a second layer, while the lowest triplet state of the p-type organic material is lower than that of the n-type organic material.

In such a layer structure with a multifunctional layer, which comprises the p-type conductor and the luminescent material with the given relative level of the energy states, the luminescence-generating processes have a particularly high efficiency.

It may in addition be preferred that a p-type organic material is contained in a first layer and an n-type organic material and the luminescent material are contained in a second, homogeneous layer, while the lowest triplet state of the n-type organic material is lower than that of the p-type organic material.

This configuration also shows a very good luminous efficacy.

It may also be preferred that a p-type organic material is present together with the luminescent material in a first homogenous layer, and an n-type organic material together with the luminescent material in a second homogenous layer.

This configuration has the highest efficacy for approximately equal positions of the energy levels of the triplet states of the organic materials. In addition, a good mutual material matching in the layer structure is achieved thereby.

An embodiment of the invention which is particularly easy to manufacture is that, in which one or several p-type organic materials, the electroluminescent material, and one or several n-type organic materials are contained in one homogeneous layer, while the redox potentials of the n- and p-type materials are greater than those of the electroluminescent material(s).

It may be preferable within the framework of the present invention that one or several p-type organic materials, one or several n-type organic materials, and the luminescent material are each arranged in a separate layer, while the layer with the luminescent material lies between the layer with the p-type organic material(s) and that with the n-type material (s).

The properties of the three functional layers can be separately optimized in this embodiment. The layer with the luminescent material may be made particularly thin here, whereby the external luminous efficacy is increased.

The p-type organic materials may be a molecule-doped organic polymer, a semiconducting conjugated polymer, an intrinsically conducting organic polymer, or a p-type organic monomer, or a mixture thereof.

A particularly preferred embodiment is characterized in that the p-type organic material is formed by the organic ligands of the rare earth metal ion. The recombination of positive and negative charge carriers takes place directly on the ligands in this embodiment. An improved efficacy is obtained through this direct energy transfer.

The n-type organic materials may be a molecule-doped organic polymer, an intrinsically conducting organic polymer, or an n-type organic monomer, or a mixture thereof.

In particular the molecule-doped organic polymers, both the p-type and the n-type ones, allow for a separate optimization of thermal and electrical properties.

Layers with monomers have the advantage that they can be very readily manufactured because they can usually be provided in a vapour deposition process.

It is in addition preferred that the ligands of the rare earth metal ions are chelating oxygen, sulphur, or nitrogen ligands. Such complexes excel through an intensive energy transfer and the possibility of generating pure colours.

In a preferred embodiment of the organic electroluminescent component, the p-type organic material is poly(N-vinylcarbazole), the complex of the rare earth metal ion is europium(III)-phenantroline-tri-thenoyltrifluoroacetylacetonate(EuCHfa)$_3$phen), and the n-type material is 2-(4-biphenylyl)-5-(phenyl)-1,3,4-oxadiazole (PBD).

In another preferred embodiment, the p-type organic material is poly(N-Vinylcarbazole), the complex of the rare earth metal ion is terbium(III)-di-bipyridyltribenzoat)(Tb (benz)$_3$bipy$_2$), and the n-type organic material is 2,5-diphenyl-1,3,4-oxadiazol (PPD).

The invention will be explained in more detail below with reference to drawings and examples.

Figure 1:
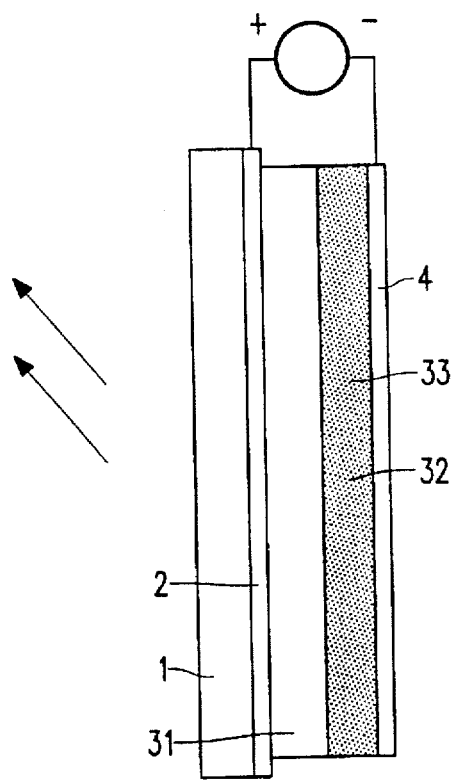
FIGS. 1-4 are cross-sectional views of electroluminescent embodiments of the invention.

FIG. 1 shows the construction principle of an organic electroluminescent component according to the invention with two active optoelectronic layers.

Figure 2:
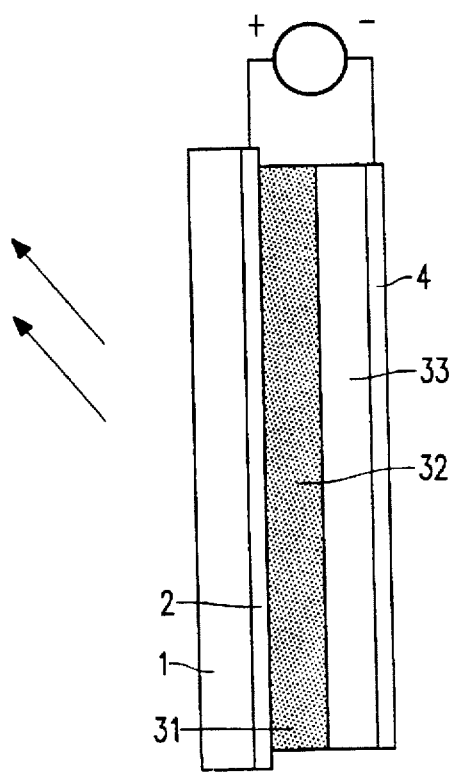

FIG. 2 shows another embodiment of the invention with two active optoelectronic layers.

Figure 3:
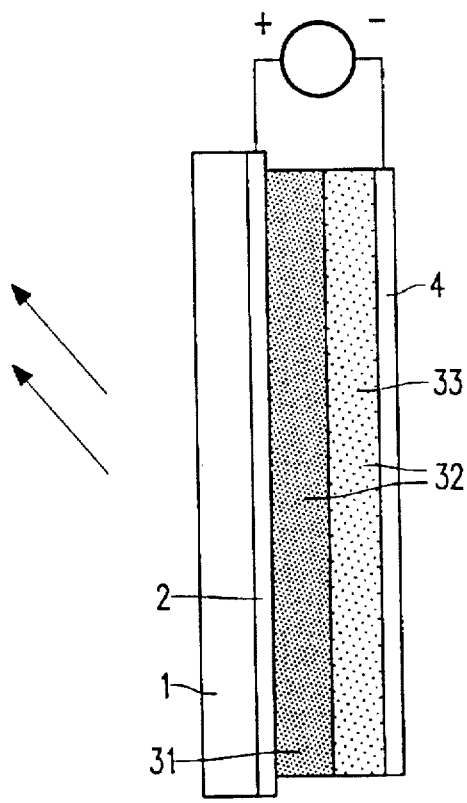

FIG. 3 shows a further embodiment of the invention with two active optoelectronic layers.

Figure 4:
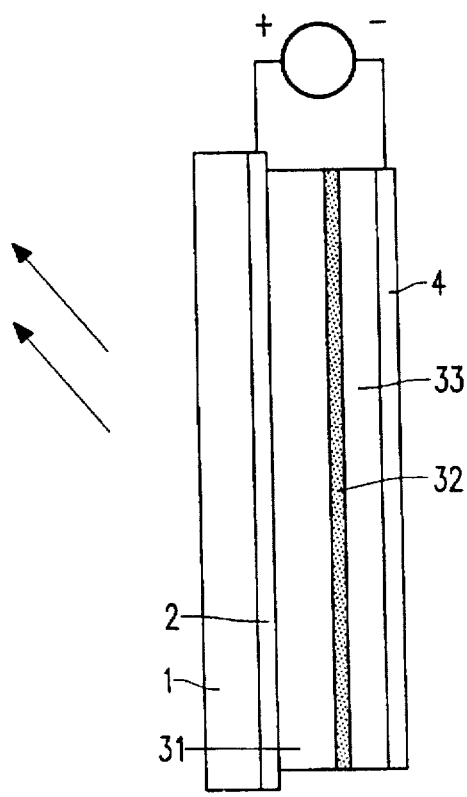

FIG. 4 shows a further embodiment of the invention with three active optoelectronic layers.

DETAILED DESCRIPTION OF THE INVENTION

The organic electroluminescent component according to the invention comprises a layer structure with a substrate layer 1, a first, transparent electrode layer 2, one or several layers 3 possibly with a p-type organic material 31, with a luminescent material with one or several complexes of a rare earth metal ion with organic ligands 32, an n-type organic material 33, as well as a second electrode 4.

A DC voltage is applied to the two electrodes during operation. The first electrode is at a positive potential (anode), the second at a negative potential (cathode).

Usually, the optoelectronic intermediate layer 3 is formed by two separate layers for the p-type, i.e. hole-conducting material 31, and the n-type, i.e. electron-conducting material 33. In this case, either the p-type layer, as in FIG. 2, or the n-type layer, as in FIG. 1, or both, as in FIG. 3, may in addition comprise the electroluminescent material 32 with one or several complexes of a rare earth metal ion with organic ligands.

In a further embodiment shown in FIG. 4, the three materials are arranged in three separate layers: hole conductor, luminescent layer, electron conductor.

As the Figures show, a plate of light-transmitting material always serves as the substrate 1, for example a glass plate. The anode 2 is provided thereon as a thin film of a few hundreds nm thickness, which must also be light-transmitting. Then follow the p-type and then the n-type layer, or the combined layer with p- and n-type material as well as the electroluminescent layer. The thicknesses of these layers lie between 10 and 100 nm. The organic electroluminescent component is completed with the cathode 4.

Suitable materials for the transparent anode, from which holes are injected into the p-type layer, are metals, metal oxides, or electrically conducting organic polymers with a high work function for electrons. Examples are thin, transparent layers of indium-doped tin oxide (ITO), gold, or polyaniline.

Molecule-doped organic polymers, intrinsically conductive organic polymers, i.e. polymers which themselves are capable of conducting, or conductive organic monomers are used for the p-type layer. A condition is that the lowest triplet state of such a polymer or monomer is at a higher level than that of the ligands of the rare earth metal complex: $T_1^P > T_1^L$, where $T_1^P$ is the lowest triplet state of the p-type conducting organic polymer and $T_1^L$ is the lowest triplet state of the ligand of the rare earth metal complex.

An example of an intrinsically p-type conducting organic polymer is poly(N-vinylcarbazol) having a $T_1^P$ of approximately 23000 cm$^{-1}$.

Traditionally, organic polymers serve as insulators or coverings in the electrical and electronics industry because of their usually negligible electrical conductance. In recent times, however, it has become possible to modify the conductance of organic polymers by means of dopants, so by the introduction of exactly defined impurities, so that they can also act as current conductors in electronic systems. Such doped organic polymers are, for example, polyacetylene doped with arsenic pentafluoride or iodine. These polymers have a metallic sheen.

Another class of doped organic polymers are the so-called molecule-doped polymers (MDP) as described, for example, by P. M. Borsenberger and D. S. Weiss in "Organic Photoreceptors for Imaging Systems", Marcel Dekker, New York (1993). These are molecularly dispersed binary solid solutions of monomers, capable of transporting electric charges, in inert, inactive polymer matrix molecules.

A highly suitable MDP material with p-type conductivity properties is the solid solution of the p-type conductor N,N'-diphenyl-N,N'-bis(3-methylphenyl)-1,1'-biphenyl-4, 4'-diamine (TPD) as a dopant in a matrix of polymethyl methacrylate or bisphenol A-polycarbonate.

Poly(p-phenylene vinylene) and its derivatives or poly (methylphenyl silane) is also suitable for p-type layers without electroluminescent additives. In layers with electroluminescent additives, however, their capability of forming non-radiating transitions from the $T_1$ state is disadvantageous.

Possible p-type organic monomers for use in the present invention are, for example, triphenylamine having a $T_1^P$ of approximately 24 500 cm$^{-1}$, tritoluolamine having a $T_1^P$ of approximately 24 000 cm$^{-1}$, and triphenyldiamine having a $T_1^P$ of approximately 18 000 cm$^{-1}$. Also suitable are compounds of the composition: with G=Cyclohexylene,-(CH$_2$)$_n$-and-(CF$_2$)-with n=1,2,3,4,5. These p-type conductors have triplets with $T_1^P$ of approximately 24000 cm$^{-1}$.

Intrinsically conducting organic monomers and polymers, or polymers provided with molecular dopants are also used for the n-type conducting layer. Intrinsically conducting organic monomers suitable for the electron-transporting layer are 3,4,9,10-perylene-tetracarboxy-bis-benzimidazol, 2-(4-biphenylyl)-5-(tert.-butylphenyl)-1,3,4-oxadoiazole (butyl-PBD), 2-(4-biphenylyl)-5-phenyl-1,3,4-oxadiazole (PBD) having a $T^1_n$ of approximately 20 500 cm$^{-1}$, or 2,5-diphenyl-1,3,4-oxadizole (PPD) having a $T^1_n$ of approximately 23 500 cm$^{-1}$, and 8-hydroxyquinoline-aluminum (Alq$_3$).

Polymethyl methacrylate doped with 8-hydroxyquinoline-aluminium (Alq$_3$) may be used as the n-type molecule-doped organic polymer.

Further molecule-doped organic polymers which may be used according to the invention are formed, for example, by polymethyl methacrylate (PMMA), polystyrol, or bisphenol A-polycarbonate for the matrix with a doping of oxadiazols such as 2-(4-biphenylyl)-5-(tert.-butylphenyl)-1,3,4-oxadiazol (butyl-PBD) ($T_1 \approx 20\ 500$ cm$^{-1}$) and 2,5-diphenyl-1,3,4-oxadiazol (PPD) ($T_1 \approx 23\ 400$ cm$^{-1}$), or triazols such as 3,4,5-phenyl-1,2,4-triazol and 3-(4$^1$-t-butylphenol)-4-phenyl-5-(4$^{11}$-biphenyl)-1,2,4-triazol.

If only one organic layer is used, i.e. the p-type and n-type organic polymers or monomers, as applicable, are arranged in a joint, homogeneous layer, molecule-doped polymers may be used, for example, doped with p-type substances and with n-type substances. An advantageous combination is that of butyl-PBD in polymethyl methacrylate, polystyrol, or bisphenolA-polycarbonate, with other materials such as triphenylamine, triphenyldiamine, or tritoluolamine.

The electroluminescent material is one or comprises several metallicorganic complexes of rare earth metals with organic oxygen, sulphur, or nitrogen ligands. The term metallicorganic complexes should be understood to mean for the purpose of the present invention those complexes with said organic ligands in which the bonds are achieved via the hetero-atoms. Depending on the desired colour of the emitted light, several rare earth metal complexes may also be used. It is also possible to use rare earth metal complexes which cannot be sublimated or which are not electrically conductive.

The rare earth metal ion may be, for example, $Eu^{2+}$, $Eu^{3+}$, $Tb^{3+}$, $Tm^{3+}$, $Dy^{3+}$, $Sm^{3+}$, or $Pr^{3+}$.

The fluorescence colour which can be achieved with europium and samarium complexes is red, with terbium complexes green, and with thulium and dysprosium complexes blue. Particularly suitable are rare earth complexes of the general composition $SE[L_1]_3[L_2]_n$. SE here is a trivalent rare earth cation, $L_1$ is an anionic ligand which may be monodentate or bidentate, and $L_2$ is a neutral ligand which may be monodentate or bidentate. n is chosen such that all coordination points of the rare earth ion are saturated, so that n can assume the values 0, 1, 2, 3 and 4. $L_1$ and $L_2$ are always two different ligands. The corresponding formula for $Eu^{2+}$ is $Eu[L_1]_2[L_2]_n$.

The beta-diketonates $R_1C(OH)CHCOR_2$ are particularly suitable for forming the ligand $L_1$. The rests $R_1$ and $R_2$ may be an $F_3C$—, thenoyl $C_4H_3S$—, furanoyl $C_4H_3O$—, t-butyl and perfluoro-n-propyl $C_3F_7$. When $R_1$ $_{and\ R2}$ are $CF_3$ rests, the beta-diketonate hexafluoracetyl acetonate (hfa) is obtained. When $R_1$ and $R_2$ are t-butyl rests, the beta-diketonate 2,2,6,6-tetramethyl-3,5-heptandion (thd) is obtained. When $R_1$ is a thenoyl rest and $R_2$ is a $CF_3$ rest, the beta-diketone thenoyldifluoro-acetylacetonate (ttfa) is obtained. When $R_1$ is a furanoyl rest and $R_2$ is a $CF_3$ rest, the beta-diketone furanolyl-trifluoroacetylacetonate (ftfa) is obtained. When $R_1$ is a t-butyl rest and $R_2$ is a perfluoro-n-butyl rest, the beta-diketone 7,7-dimethyl-1,1,1,2,2,3,3-heptafluor-4,6-octandion (FOD) is obtained. A further beta-diketone suitable as a ligand is 3-(trifluoromethyl hydroxymethylene)-1-camphor.

Particularly efficient chelating complexes of rare earths have ligands $L_1$ which are anions of aromatic carbonic acids such as benzoic acid, picolinic acid and dipicolinic acid.

The ligands $L_2$ are neutral ligands which may be monodentate or multidentate. The monodentate ligands may be pyridine and derivatives thereof, trialkyl-, alkylphenyl-, and triphenyl-phosphinoxide, dialkyl-, alkylphenyl-, and diphenyl-sulfoxide, alkyl-, alkylphenyl-, and phenyl-amine, as well as alkyl-, alkylphenyl-, and phenylphosphate.

Suitable multidentate ligands are 2,2'bipyridine, 2,2',6, 2"terpyridine, 1,10phenantroline and N,N,N',N'-tetramethylethylene diamine and derivatives thereof.

The concentration of the above rare earth metal complexes should not exceed 20 mole % so as not to influence the transport properties of the conductive organic polymers, for the rare earth metal compounds are mostly insulators.

It is also possible to use ligands which themselves have transport properties. Such ligands are, for example, the carboxylic acids of diphenylamine or triphenylamine, such as diphenylamine-2-carboxylic acid or diphenylamine-2,2'-dicarboxylic acid, as well as phenantrolin(phen), bipyridine (bipy) and terpyridine. Complexes with these ligands are p-type conductors.

Metals with a low work function are used as materials for the cathode because electrons must be injected into the n-type layer from the cathode. Such metals are aluminium, magnesium, and of magnesium with silver or indium, and calcium.

The p- and n-type layers may be provided from a solution, vapour-deposited, or polymerized in situ.

The rare earth metal complexes may be deposited by sublimation, if they allow themselves to be evaporated, possibly jointly with the electrically conductive organic monomers.

If they are to be provided together with an electrically conductive organic polymer, it is necessary to dissolve the two components in a common solvent or solvent mixture so as to form a single coating solution.

A better efficacy for the conversion of the electrical input power into light is achieved with the above material combinations according to the invention. This conversion starts when the voltage applied across the functional intermediate layers has exceeded a given threshold value. Then the positive charge carriers, i.e. holes, are injected from the anode into the adjoining layer. Similarly, negative charge carriers, i.e. electrons, are injected from the cathode. The recombination of holes and electrons takes place in a more or less narrow zone at the interface between the p-type and n-type conducting layers. The energy $E_{rec}$ released upon the recombination is:

$$E_{rec} = I - P_+ - A - P_- - I - A - 2P$$

where I is the molecular ionization energy of the hole conductor, A the molecular electron affinity of the electron conductor, $P_+$ and $P_-$ the polarization energies of the hole and the electron, respectively, which may be regarded as approximately equal.

Owing to this recombination, electrically neutral excitation states of the organic molecules are occupied when their excitation energy is equal to or smaller than the energy $E_{rec}$ released during the recombination. Normally, these states involve the lowest-level excited singlet state $S_1$ and the lowest-level triplet state $T_1$, which in organic substances usually lies below $S_1$.

These excited states are not localized at single molecules, but they may be exchanged between adjoining molecules and thus diffuse through the material over a few hundreds of molecule layers. These movable excited states are called excitons. There are singlet and triplet excitons, corresponding to the relevant energy levels involved. Singlet excitons arise when the spins of electron and hole were antiparallel, triplet excitons when these were parallel. In the case in which both the $S_1$ and the $T_1$ level are energetically achievable, the number of triplet excitons will be three times the number of singlet excitons for multiplicity reasons.

In the electroluminescent components according to the prior art, a light quantum only arises upon the transition of a molecule from the singlet state to the state ground. The radiant transition from the triplet level $T_1$ to the state ground is forbidden. For this reason the life of the excited $T_1$ state is very long, so that then competing, non-radiating transitions gradually empty the $T_1$ state, whereby thermal energy is released.

The radiant transitions from the $T_1$ state into the basic state, which are forbidden per se, can only be observed in the form of phosphorescence at very low temperatures, e.g. at the temperature of liquid nitrogen.

The organic LEDs according to the prior art utilized the singlet states only and accordingly have a low efficacy. In the known organic LEDs, the holes and electrons injected into the boundary surface of the electrode are transported up to the transition between p-type and n-type material. As in the electroluminescent components according to the invention, a strong space charge accumulates here and the charge carriers recombine. When both the singlet state and the triplet state are energetically achievable, singlet and triplet excitons in the ratio 1:3 are thus generated, which subsequently can diffuse a certain distance through the material. The excitons give their energy and their spin to electroluminescent emitter molecules of low energy level. These excited molecules then either perform a radiant transition into the basic state, whereby the desired luminescent quantum is emitted, or they lose the energy in a non-radiating transition, so that this excitation energy is lost for the luminescent efficacy.

The total efficiency of such an electroluminescent component according to the prior art is composed of $\phi_{rec}$, the efficiency with which the injected charge carriers recombine, and $\phi_{rad}$, the probability with which the generated excitons will cause a radiating transition.

The total efficiency of material combinations for electroluminescent components according to the prior art is thus $\phi_{ef} = \phi_{rec} 0.25 \phi_{rad}$. The factor 0.25 here serves to take into account the production frequency of the singlet excitons.

The theoretical upper limit for the luminous efficacy in prior art organic LEDs is therefore 25%, provided both the recombination and also the radiating decay of the excitons take place with a probability factor 1. The upper limit for prior art LEDs is based on the fact that only singlet excitons are capable of causing permitted, radiating transitions.

According to the invention, however, the triplet excitons are also utilized in that the possibility of energy transfer from the generated triplet states to the rare earth metal ion is created.

For this purpose, the n- or p-type organic monomers or polymers are coupled to an electroluminescent material (emitter) which comprises organometallic complexes of the rare earth metals with low-level emission states. The lowest emission level of the rare earth metal ion then lies so far below the singlet and triplet states of the organic ligands that no thermally activated back transfer of activation can take place. In these rare earth metal complexes, not only the normal singlet-singlet transitions but also the energy transfer from the lowest triplet state of the organic ligand to the emission level of the central rare earth metal ion is permitted.

This additional permitted energy transfer renders it possible now to utilize the triplet excitons for the light generation. A condition for this is the correct positions of the triplet states of the various materials relative to one another. It is not the absolute values of the energy states, but their relative positions which are important for the choice of the material combinations according to the invention. The triplet state which is occupied through recombination of electron and hole must lie above the triplet state of the ligand, because otherwise no energy transfer to the ligands is possible. When these conditions are fulfilled, however, the molecules of the rare earth metal complex act as traps for the triplet excitons which here are converted into visible light. The quantum efficiency of these transitions may be very high, for example, it lies at almost 70% in the case of Eu (ttfa)$_3$phen and Tb(benz)$_3$bipy$_2$.

The total efficiency of the material combinations according to the invention may thus be written as:

$$\phi_{ef} = \phi_{rec} 0.25 \phi_{radcomplexS1} + \phi_{rec} 0.75 \phi_{radcomplexT1}$$

The first term relates to the contribution from the singlet excitons. The second term gives the contribution from the triplet excitons which is also used according to the invention.

When the electroluminescent component according to the invention is composed of two separate layers for the p- and n-type polymers, and the first excited triplet state of the material of one layer lies lower than that in the other layer, the triplet excitons will preferably diffuse into this latter layer with triplet states of lower energy level. This holds as well for the singlet excitons. Only the relevant rare earth metal complexes introduced into this layer can act as traps for the excitons and convert the electrical input energy into photons. According to the invention, the rare earth metal complex must be added to at least one of the organic layers, i.e. to that layer whose $T_1$ state lies at the lower level.

Various constellations are accordingly possible for the manufacture of the organic electroluminescent components according to the invention so as to achieve an effective arrangement of the p- and n-type layers and the electroluminescent layer.

FIG. 1: $T_1^P>T_1^n$: the triplet excitons diffuse mainly into the n-type layer, so that the latter must contain the rare earth metal complexes as exciton traps. Thus we have $T_1^n>T_1^L$ here.

FIG. 2: $T_1^P<T_1^n$: the triplet excitons diffuse mainly into the p-type layer, so that the latter must contain the rare earth metal complexes as the exciton traps. Thus we have $T_1^P>T_1^L$ here.

FIG. 3: $T_1^P\approx T_1^n$: the triplet excitons diffuse both into the p-type and into the n-type layer, so that both must contain the rare earth metal complexes as the exciton traps. In this case: $T_1^P>T_1^L$ and $T_1^n>T_1^L$.

The exact positions of the singlet, triplet, or emitting states are derived from the absorption spectra or the phosphorescence spectra of the relevant compounds.

EXAMPLE 1

The following mixture is applied to an ITO-coated glass substrate by spinning at approx. 70 rpm:
1 ml PVK as a 2% solution in chlorobenzene;
1 ml PBD as a 1% solution in chlorobenzene;
0.1 ml Eu(ttfa)$_3$phen as a 1% solution in chlorobenzene.

Layer thickness after drying is approx. 100 nm. Calcium electrodes, 20 nm thick, are then vapour-deposited at $10^{-5}$ mbar and covered with 200 nm thick aluminium. When the positive pole of a voltage source is connected to the ITO and the negative pole to the calcium, a bright red luminescence appears from 14 V upwards, consisting solely of the characteristic europium lines.

EXAMPLE 2

The following mixture is applied to an ITO-coated glass substrate by spinning at approx. 70 rpm:
1 ml PVK as a 2% solution in chlorobenzene;
1 ml PBD as a 1% solution in chlorobenzene;
0.1 ml Tb(benz)$_3$bipy$_2$ as a 1% solution in dimethyl formamide.

Layer thickness after drying is approx. 100 nm. Calcium electrodes, 20 nm thick, are then vapour-deposited at $10^{-5}$ mbar and covered with 200 nm thick aluminium. When the positive pole of a voltage source is connected to the ITO and the negative pole to the calcium, a bright green luminescence appears from 14 V upwards, consisting solely of the characteristic terbium lines.

EXAMPLE 3

Layers are vapour-deposited on an ITO-coated glass substrate in the following sequence at approx. $10^{-5}$ mbar:
TPD to a layer thickness of 50 nm, as a hole conductor;
Eu(ttfa)$_3$phen as the luminescent material;
Alq$_3$ as an electron conductor;
calcium, 20 nm, and aluminium, 200 nm, as the electrode.

When the positive pole of a voltage source is connected to the ITO and the negative pole to the calcium, a bright red luminescence appears from 7 V upwards, consisting solely of the characteristic europium lines.

EXAMPLE 4

Layers are vapour-deposited on an ITO-coated glass substrate in the following sequence at approx. $10^{-5}$ mbar:
TPD to a layer thickness of 50 nm, as a hole conductor;
Eu(ttfa)$_3$phen with bu-PBD mixed in a ratio of 1:25, to a layer thickness of 50 nm, as the luminescent material;
Alq$_3$ to a layer thickness of 35 nm as an electron conductor;
calcium, 20 nm, and aluminium, 200 nm, as the electrode.

When the positive pole of a voltage source is connected to the ITO and the negative pole to the calcium, a bright red luminescence appears from 7 V upwards, consisting solely of the characteristic europium lines.

EXAMPLE 5

Layers are vapour-deposited on an ITO-coated glass substrate in the following sequence at approx. $10^{-5}$ mbar:
TPD to a layer thickness of 50 nm, as a hole conductor;
Eu(ftfa)$_3$phen to a layer thickness of 30 nm as the luminescent material;
Alq$_3$ to a layer thickness of 30 nm as an electron conductor; calcium, 20 nm, and aluminium, 200 nm, as the electrode.

When the positive pole of a voltage source is connected to the ITO and the negative pole to the calcium, a bright red luminescence appears from approx. 13 V upwards, consisting solely of the characteristic europium lines.

EXAMPLE 6

Layers are vapour-deposited on an ITO-coated glass substrate in the following sequence at approx. $10^{-5}$ mbar:
TPD 50 nm, as a hole conductor;
Eu(thd)$_3$phen 30 nm, as the luminescent material;
Alq$_3$ 50 nm, as an electron conductor;
calcium, 20 nm, and aluminium, 200 nm.

When the positive pole of a voltage source is connected to the ITO and the negative pole to the calcium, a bright green luminescence of the Alq$_3$ initially appears from 7 V upwards, changing after a few minutes into a bright red luminescence consisting solely of the characteristic europium lines.

Example for Comparison

The following mixture is applied to an ITO-coated glass substrate by spinning at approx. 70 rpm:
1 ml PVK as a 2% solution in chlorobenzene;
1 ml PBD as a 1% solution in chlorobenzene;
0.1 ml Tb(benz)$_3$bipy$_2$ as a 1% solution in dimethyl formamide.

Layer thickness after drying is approx. 100 nm. Calcium electrodes, 20 nm thick, are then vapour-deposited at $10^{-5}$ mbar and covered with 200 nm thick aluminium.

When the positive pole of a voltage source is connected to the ITO and the negative pole to the calcium, a very weak bluish luminescence appears from 18 V upwards, consisting of a wide basic region with superimposed weak lines characteristic of terbium.

We claim:
1. An organic electroluminescent component with a layer structure comprising a) a substrate layer, b) a first transparent electrode layer deposited atop said substrate layer c) one or several functional optoelectronic layer(s) deposited atop said first electrode layer and comprising, c1) one or several p-type organic materials with one or several single states and one or several triplet states, c2) a luminescent material with one or several organometallic complexes of a rare earth metal ion with organic ligands, in which the rare earth metal ion has an emitting state and the organic ligands have one or several single states and one or several triplet states, and c3) one or several n-type organic materials with one or several single states and one or several triplet states, and wherein the triplet state of lowest energy of the ligands is lower than the triplet states of lowest energy of any of the n-type and the p-type organic materials but higher than above the emitting state of the rare earth metal ion, and e a second electrode layer deposited atop said optoelectronic layer (s).

2. An organic electroluminescent component as claimed in claim 1, characterized in that said one or several p-type organic material and said luminescent material are present in a first, homogeneous layer, and said one or several n-type organic material is present in a second layer, while the lowest triplet state of the p-type organic material is lower than that of the n-type organic material.

3. An organic electroluminescent component as claimed in claim 1, characterized in that said one or several p-type organic material is contained in a first layer and said one or several n-type organic material and said luminescent material are contained in a second, homogeneous layer, while the lowest triplet state of the n-type organic material is lower than that of the p-type organic material.

4. An organic electroluminescent component as claimed in claim 1, characterized in that said one on several p-type organic material is present together with said luminescent material in a first homogenous layer, and said one on several n-type organic material together with said luminescent material are in a second homogenous layer.

5. An organic electroluminescent component as claimed in claim 1, characterized in that said one or several p-type organic materials, the electroluminescent material, and said one or several n-type organic materials are contained in one homogeneous layer, while the redox potentials of the n- and p-type materials are greater than those of the electroluminescent material(s).

6. An organic electroluminescent component as claimed in claim 1, characterized in that one or several p-type organic materials, one or several n-type organic materials, and the luminescent material are each arranged in a separate layer, while the layer with the luminescent material lies between the layer with the p-type organic material(s) and that with the n-type material(s).

7. An organic electroluminescent component as claimed in claim 1, characterized in that the p-type organic materials are a molecule-doped organic polymer, a semiconducting conjugated polymer, an intrinsically conducting organic polymer, or a p-type organic monomer, or a mixture thereof.

8. An organic electroluminescent component as claimed in claim 1, characterized in that the p-type organic material is formed by the organic ligands of the rare earth metal ion.

9. An organic electroluminescent component as claimed in claim 1, characterized in that the n-type organic materials are a molecule-doped organic polymer, an intrinsically conducting organic polymer, or an n-type organic monomer, or a mixture thereof.

10. An organic electroluminescent component as claimed in claim 1, characterized in that the ligands of the rare earth metal ions are chelating oxygen, sulphur, or nitrogen ligands.

11. An organic electroluminescent component as claimed in claim 1, characterized in that the p-type organic material is poly(vinylcarbazol), the complex of the rare earth metal ion is europium(III)-phenanthroline-tri-thenoyltrifluoroacetylacetonate and the n-type material is 2-(4-biphenyllyl)-5-(tert.butylphenyl)-1,3,4-oxadiazol PBD.

12. An organic electroluminescent component as claimed in claim 1, characterized in that the p-type organic material is poly(N-vinylcarbazol) the complex of the rare earth metal ion is terbium(III)-di-bipyridyl-tribenzoat Tb Cbenz)$_3$bipy$_2$, and the n-type organic material is 2,5-diphenyl-1,3,4-oxadiazole.

* * * * *